Jan. 19, 1960 J. R. GOODYKOONTZ, JR., ET AL 2,921,550

ASSEMBLY APPARATUS FOR ELECTRONIC MODULES

Filed Nov. 29, 1957 2 Sheets-Sheet 1

INVENTORS.
JAMES R. GOODYKOONTZ JR.,
GEORGE RASMUSSEN,
BY
Donald L. Ryne
AGENT

Jan. 19, 1960 J. R. GOODYKOONTZ, JR., ET AL 2,921,550

ASSEMBLY APPARATUS FOR ELECTRONIC MODULES

Filed Nov. 29, 1957 2 Sheets-Sheet 2

INVENTORS.
JAMES R. GOODYKOONTZ JR.,
GEORGE RASMUSSEN,
BY
Donald L. Royer
AGENT.

United States Patent Office 2,921,550

Patented Jan. 19, 1960

2,921,550

ASSEMBLY APPARATUS FOR ELECTRONIC MODULES

James R. Goodykoontz, Jr., Santa Monica, and George Rasmussen, Long Beach, Calif., assignors to Hughes Aircraft Company, Culver City, Calif., a corporation of Delaware Application November 29, 1957, Serial No. 700,257

6 Claims. (Cl. 113—99)

The present application relates generally to an apparatus for assembling electronic circuit modules and relates more particularly to a device for use in properly aligning electrical or electronic components to enable assembly between a pair of printed circuit boards.

With the advent of increased usage of electronic devices and requirements to place such devices, together with interconnecting wiring, in as small a space as possible, there has been developed a module form that is known as either a sandwich type construction or a cordwood arrangement, the former term being descriptive of the fact that components are disposed between a pair of spaced parallel boards having printed circuits carried thereon, with the latter term being descriptive of the positions of the components between the parallel boards. The chief advantage of this particular package configuration is in the high component density which it permits, as compared to that of a conventional flat printed wiring assembly wherein components lie flat against the board and wherein component leads are bent and inserted in suitable openings. Thus, with a packaging arrangement of the present type, an increase in efficiency may be obtained and, due to the use of a multiplicity of components as structural members of the assembly, a high degree of strength and rigidity is attained without reliance upon brackets or other excess parts.

While the sandwich or cordwood type of assembly package for electronic circuits presents many advantages, serious difficulties have been experienced heretofore in connection with assembly of components in a manner to enable use of this package in high production manufacture thereof. The basic problem in connection with such an assembly of this sandwich or cordwood module has been that of aligning all electrical or electronic component leads with sufficient accuracy as to enable disposition of a printed circuit board thereon and free passage of all of such leads through openings in the board. This problem of assembly is further complicated due to the fact that the components employed are in most instances relatively small with an average modulate containing between 50 and 100 components that are arranged in a space approximately ¾" square and 4" long.

A still greater advantage is seen in the use of the sandwich or cordwood electronic module assembly package in connection with contemporary requirements for repetitive circuits as may be employed in electronic computers and like apparatus. In such apparatus only a few different types of modules are required, a complete unit containing a large number of each individual type of module. These modules may be provided with connector pins in order that they may be plugged in to a master board in such a manner as to be easily removed for repair or replacement. It may thus be seen that the amount of wiring, the size and weight of chassis and supporting brackets or the like, are reduced to a bare minimum commensurate with a rigid structure having superior vibration resistant characteristics and other improved factors as discussed hereinbefore.

While apparatus has now been developed to provide automatic assembly of sandwich or cordwood type modules, it is frequently necessary to assemble one or more low production modules or to assemble a few such modules for test purposes. In such instances it is most practical to assemble such low production modules by hand rather than with automatic machinery. In order to accomplish such hand assembly of these modules, the present apparatus is provided.

Generally, the apparatus includes a plurality of notched bars that are stacked one upon the other and retained in this position, electrical or electronic components having leads thereof disposed in the notches and extending laterally from each side thereof. Thereafter a pair of printed circuit boards, having a plurality of openings, are disposed with the component leads extending through the openings, such leads being thereafter secured in place as by soldering.

It is accordingly one object of the present invention to provide a novel apparatus for assembling a sandwich or cordwood type of electronic circuit module.

It is another object of the invention to provide a novel apparatus to enable hand assembly of sandwich or cordwood type of electronic circuit modules.

It is a further object of the invention to provide hand assembly means for sandwich or cordwood type of electronic circuit modules wherein means are provided to insure accurate disposition of electrical components in a three dimensional manner and to retain such components in position for assembly of hole carrying printed circuit boards therewith.

A still further important object of the present invention is to provide a three-dimensional electrical circuit unit assembly means that is efficient in operation, reliable and effective in use, economical in manufacture and which may be used by relatively inexperienced operators.

Other and further important objects of the invention will become apparent from the disclosures in the following detailed specification, appended claims and accompanying drawings, wherein:

With reference to the drawings, the assembly apparatus of this invention is shown as indicated generally at 10. This apparatus is adapted to provide means for assembling the circuit module shown at 11 in Fig. 4.

Figure 3:
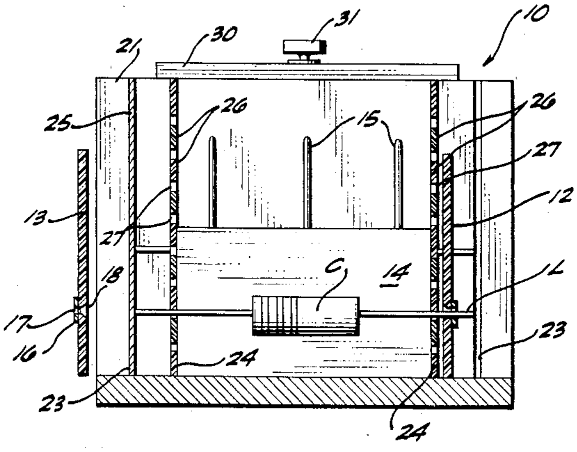
Fig. 3 is a transverse sectional view, taken substantially as indicated by line 3—3, Fig. 2, and showing a further stage in the assembly of the present circuit module.
Figure 4:
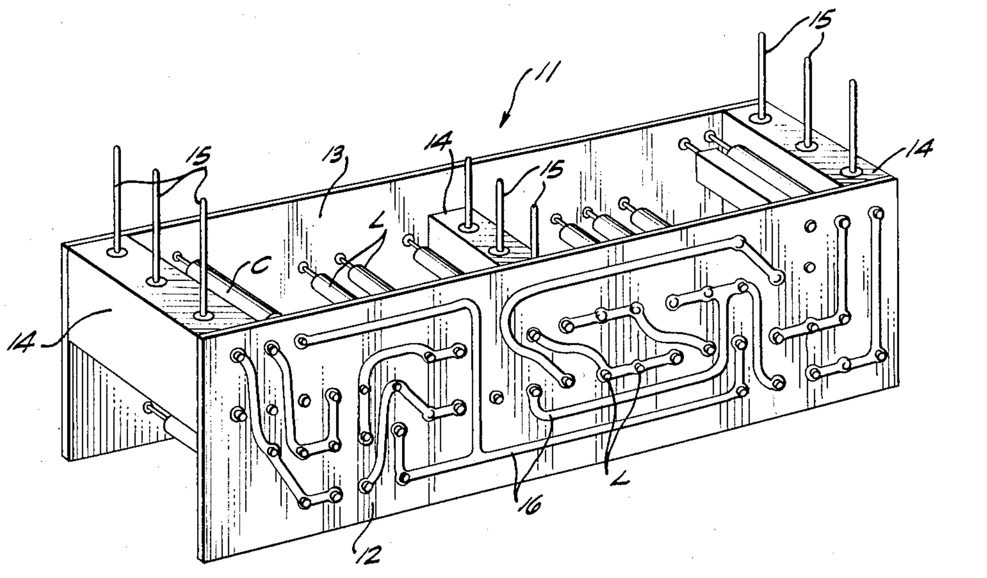
Fig. 4 is a perspective view of an example of a typical completed sandwich or cordwood type electronic circuit module.

With reference to Fig. 4, the completed example of a typical module includes a pair of printed circuit boards 12 and 13 that are disposed in spaced parallel relationship and retained in this position by means of spacers 14. The spacers 14 may be of any desired type or may include connector pins 15, thus to provide means for plugging the present module into a master chassis. The circuit boards 12 and 13 are each provided with a printed circuit pattern 16 and, with reference to Fig. 3, have a plurality of openings 17 therethrough, these openings cooperating with the printed circuit pattern 16. The ends of the openings 17, remote from the surface of the boards carrying the printed circuit pattern 16, are conically contoured as at 18 for a purpose to be hereinafter more fully described.

With reference to the apparatus 10, this apparatus includes a base 20 that is generally rectangular, there being end portions 21 secured to opposite ends of the base 20 by means of screws 22, the end portions 21 being disposed normal to the base 20. The end portions 21 have a plurality of vertically disposed grooves therein, there being laterally outer grooves 23 and inner grooves 24. The grooves 23 and 24 are arranged in pairs in facing surfaces and adjacent lateral sides of the end portions 21, the grooves 23 being adapted for reception of a plate 25 that is positioned in one or the other of the grooves 23.

The grooves 24 are adapted to retain and guide ends of a plurality of bars 26. The bars 26 have upper edges in which a plurality of equally spaced V-shaped notches 27 are positioned. Additionally, an uppermost bar 28 has an uninterrupted upper surface, and when all of the bars 26 and the bar 28 are in stacked positions, a pair of clamp members 30 engage the uppermost bar 28 and are secured to the end portions 21 by means of screws 31 which threadably engage openings 32 in upper surfaces of the end portions 21. The clamp members 30 have a lateral length sufficient to engage the upper surfaces of the bars 28 in each of the grooves 24, whereby to clamp all of the bars 26 and the bars 28 in position with respect to the base structure.

Figure 1:
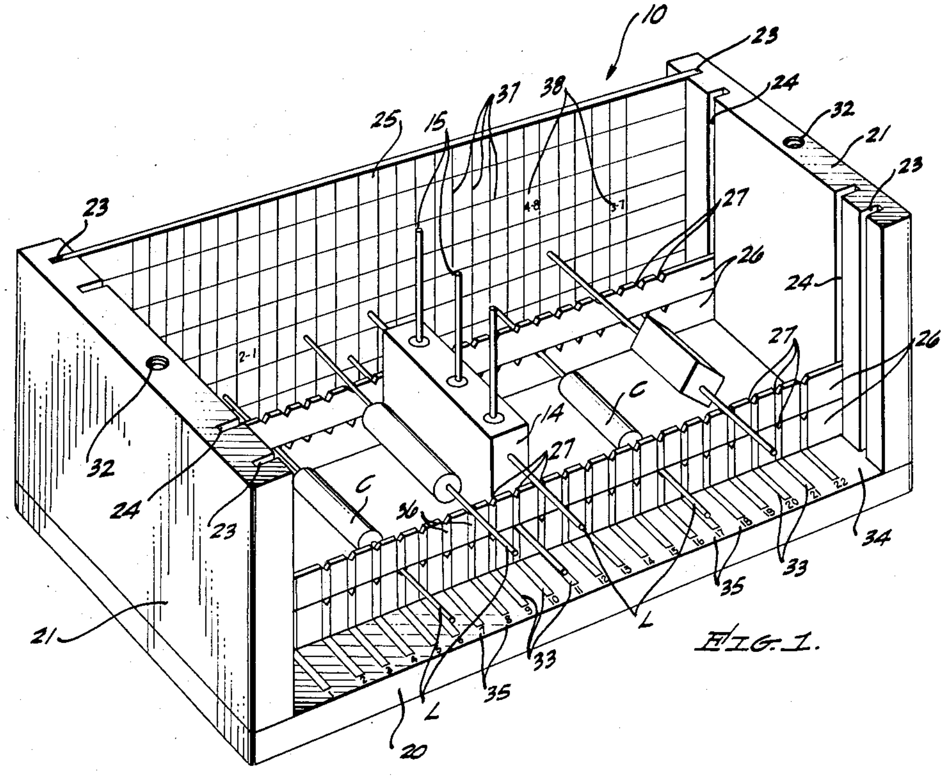
Figure 1 is a perspective view of the present circuit assembly apparatus showing electrical components in use therewith and in a partially assembled state of a module.
Figure 2:
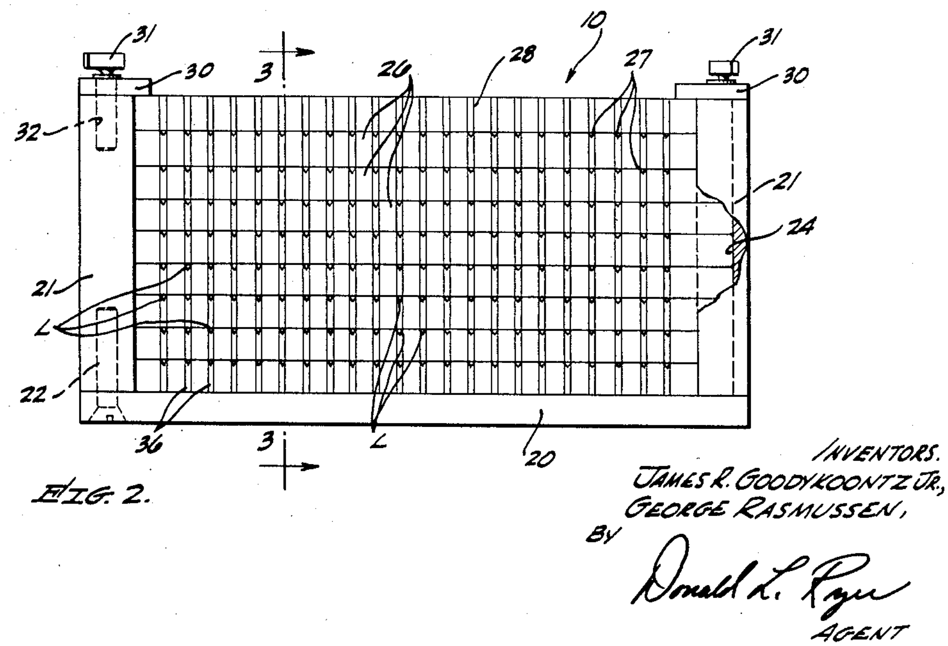
Fig. 2 is a side elevational view of the present assembly apparatus showing all supporting structure and bar elements in position.

With reference to Fig. 1, it is to be noted that a plurality of lines 33 are indicated on an upper surface 34 of the base member 20. These lines 33 are aligned with and correspond to the positions of the notches 27 in the bars 26. Additionally, each of the lines 33 may be numbered as at 35 and the bars 26 may also be provided with lines 36 that correspond to and are aligned with the lines 33 and notches 27. It is also to be noted that the plate 25 is provided with a grid 37 and numerals 38, representing particular electrical components, may be printed in the spaces provided by this grid.

Accordingly, in use of the present circuit assembly device, it may be seen that the first or lowermost of the bars 26 is placed in position and leads L of a component, indicated at C and selected in accordance with the indications 38, are placed in an appropriate pair of laterally aligned notches 27 in each of the lowermost bars 26. The lines 33 and 36, together with the numerals 35, serve to guide an operator in the proper disposition of the correct component in the appropriate pair of notches 27. This operation is repeated for each of the bars 26. When all of the desired components have been appropriately disposed with their leads L in the proper notches 27 and in association with the proper bars 26, the clamp members 30 are placed in position and, as shown in Fig. 3, one of the circuit boards 12 is disposed over the protruding ends of the leads L extending from the component C and retained in proper position within the notches 27. The components C are centered between the lateral groups of bars 26 by engagement of one of the ends of the leads L with the inner surface of the plate 25. Following disposition of the circuit board 12 on the ends of the leads L on one side of the assembly apparatus, the plate 25 is removed and disposed in the other of the grooves 23 and the second board 13 is disposed over the ends of the leads that formerly engaged the surface of the plate 25.

The conically contoured inner ends 18 of the openings 17 serve to align the ends of the leads L with the opening 17, even though the leads may be slightly bent. In this connection, the leads L are preferably straightened prior to assembly of the components C in the present apparatus. Thereafter, the clamp members 30 are removed and the assembled module, together with the bars 26, is removed from the grooves 24.

Following removal of the assembled module and bars 26 from the grooves 24, it may be seen that the components C are initially loosely contained between the assembled boards 12 and 13 and it is the practice to bend protruding ends of the leads at the outer surface of the boards 12 and 13 in order thus to retain the components in position and the boards in contact with the spacers 14. The bars 26 may be slightly rotated and removed from between the component leads, thus enabling the close disposition of the inner surfaces of the boards 12 and 13 with ends of the spacers 14.

To permanently secure the components in position, the leads L are next soldered to the printed circuit pattern 16, it being appropriate to provide such soldering by dipping the entire circuit carrying surface of the boards 12 and 13 in a bath of molten solder that flows about the protruding leads and provides a tight bond between the circuit pattern 16 and the component leads. Excess ends of the leads are thereafter removed, thus leaving the completely assembled module of the typical type shown in Fig. 4. It is to be noted that no structural components other than the boards 12 and 13, spacers 14 and the components C, together with the leads thereof, are employed in connection with the present type module and that the rigid nature of the completed structure is dependent upon the plurality of leads and the soldered association thereof with the printed circuit pattern 16.

It may thus be seen that many different types of modules may be assembled with the present apparatus and that it is only necessary to employ differently marked plates 25 for each such assembly. Thus, an inexperienced operator may assemble the desired module through use of the present apparatus and without an understanding of the circuitry completed by the module or more than a more than a mere general knowledge of electrical or electronic components.

Having thus described the invention and the present embodiment thereof, it is desired to emphasize the fact that many modifications may be resorted to in a manner limited only by a just interpretation of the following claims.

We claim:

1. In an apparatus for assembling circuit modules of a type having circuit boards positioned in spaced parallel relationship and electrical circuit components disposed laterally therebetween, leads of said components extending through openings in said boards, the combination of: a base structure having vertically disposed spaced end portions; a pair of vertically disposed spaced parallel grooves in facing surfaces of each of said end portions; a plurality of bar elements adapted for stacked disposition in each of said pair of grooves; and equally spaced notches along edges of said bar elements, said leads of said components being adapted for disposition in a laterally aligned pair of said notches in each stack of said bar elements, said leads extending laterally beyond each stack of said bar elements, whereby to position said elements in both vertical and horizontal aspects to enable free disposition of said circuit boards on said laterally extending leads of said components.

2. In an apparatus for assembling circuit modules of a type having circuit boards positioned in spaced parallel relationship and electrical circuit components disposed laterally therebetween, leads of said components extending through openings in said boards, the combination of: a base structure having vertically disposed spaced end portions; a pair of vertically disposed spaced parallel grooves in facing surfaces of each of said end portions; a plurality of bar elements adapted for stacked disposition in each of said pair of grooves; clamp means for securing said stack of bar elements to said base structure; and equally spaced notches along edges of said bar elements, said leads of said components being adapted for disposition in a laterally aligned pair of said notches in each stack of said bar elements, said leads extending laterally beyond each stack of said bar elements, whereby to position said elements in both vertical and horizontal aspects to enable free disposition of said circuit boards on said laterally extending leads of said components.

3. In an apparatus for assembling circuit modules of a type having circuit boards positioned in spaced parallel relationship and electrical circuit components disposed laterally therebetween, leads of said components extending through openings in said boards, the combination of: a base structure having vertically disposed spaced end portions; a pair of vertically disposed spaced parallel grooves in facing surfaces of each of said end portions; a plurality of bar elements adapted for stacked disposition in each of said pair of grooves; equally spaced notches along edges of said bar elements; and plate means carried by said end portions and positioned in parallel relationship with one stack of said bar elements, said leads of said components being adapted for disposition in a laterally aligned pair of said notches in each stack of said bar elements, said leads extending laterally beyond each stack of said bar elements and in engagement with said plate means, whereby to position said elements in both vertical and horizontal aspects and centrally between each stack of said bar elements to enable free disposition of said circuit boards on said laterally extending leads of said components.

4. In an apparatus for assembling circuit modules of a type having circuit boards positioned in spaced parallel relationship and electrical circuit components disposed laterally therebetween, leads of said components extending through openings in said boards, the combination of: a base structure having vertically disposed spaced end portions; a pair of vertically disposed spaced parallel grooves in facing surfaces of each of said end portions; a plurality of bar elements adapted for stacked disposition in each of said pair of grooves; clamp means carried by said end portions and engageable with an uppermost of said bar elements in each stack for securing said elements to said base structure; equally spaced notches along edges of said bar elements; and plate means removably carried by said end portions and positioned in parallel relationship with one stack of said bar elements, said leads of said components being adapted for disposition in a laterally aligned pair of said notches in each stack of said bar elements, said leads extending laterally beyond each stack of said bar elements and in engagement with said plate means, whereby to position said elements in both vertical and horizontal aspects and centrally between each stack of said bar elements to enable free disposition of said circuit boards on said laterally extending leads of said components.

5. In an apparatus for assembling circuit modules of a type having circuit boards positioned in spaced parallel relationship and electrical circuit components disposed laterally therebetween, leads of said components extending through openings in said boards, the combination of: a base structure having vertically disposed spaced end portions; a first pair of vertically disposed spaced parallel grooves in facing surfaces of each of said end portions; a plurality of bar elements adapted for stacked disposition in each of said first pair of grooves; clamp means carried by said end portions and engageable with an uppermost of said bar elements in each stack for securing said elements to said base structure; equally spaced notches along edges of said bar elements; a second pair of vertically disposed spaced parallel grooves in said surfaces of said end portions and laterally outward from said first pair of said grooves; and plate means removably positioned in one of said second pair of grooves and in parallel relationship with one stack of said bar elements, said leads of said components being adapted for disposition in a laterally aligned pair of said notches in each stack of said bar elements, said leads extending laterally beyond each stack of said bar elements and in engagement with said plate means, whereby to position said elements in both vertical and horizontal aspects and centrally between each stack of said bar elements to enable free disposition of said circuit boards on said laterally extending leads of said components.

6. In an apparatus for assembling circuit modules of a type having circuit boards positioned in spaced parallel relationship and electrical circuit components disposed laterally therebetween, leads of said components extending through openings in said boards, the combination of: a base structure having vertically disposed spaced end portions; a first pair of vertically disposed spaced parallel grooves in facing surfaces of each of said end portions; a plurality of bar elements adapted for stacked disposition in each of said first pair of grooves; a pair of screw mounted clamps carried by upper ends of each of said end portions and engageable with an uppermost of said bar elements in each stack thereof for securing said elements to said base structure; a plurality of equally spaced notches along edges of said bar elements; a second pair of vertically disposed spaced parallel grooves in said surfaces of said end portions and laterally outward from said first pair of said grooves; and plate means removably positioned in one of said second pair of grooves and in parallel relationship with one stack of said bar elements, said leads of said components being adapted for disposition in a laterally aligned pair of said notches in each stack of said bar elements, said leads extending laterally beyond each stack of said bar elements and in engagement with said plate means, whereby to position said elements in both vertical and horizontal aspects and centrally between each stack of said bar elements to enable free disposition of said circuit boards on said laterally extending leads of said components.

References Cited in the file of this patent

UNITED STATES PATENTS

| | | |
|---|---|---|
| 2,425,127 | Schafer | Aug. 5, 1947 |
| 2,699,133 | Ames et al. | Jan. 11, 1955 |
| 2,768,431 | Hughes | Oct. 30, 1956 |